United States Patent [19]
Massani et al.
[11] 3,886,471
[45] May 27, 1975

[54] ELECTRONICALLY TUNABLE GUNN OSCILLATOR WITH AUTOMATIC FREQUENCY CONTROL

[75] Inventors: Massimo Massani; Giuseppe Di Gesaro, both of Rome, Italy

[73] Assignee: Selenia-Industrie Elettroniche Associate S.p.A., Naples, Italy

[22] Filed: Mar. 7, 1974

[21] Appl. No.: 448,865

Related U.S. Application Data

[63] Continuation-in-part of Ser. No. 291,455, Sept. 22, 1972, abandoned.

[30] Foreign Application Priority Data

Oct. 5, 1971 Italy .................................. 53283/71

[52] U.S. Cl. .................... 331/10; 331/36 R; 331/96; 331/107 G; 331/177 R

[51] Int. Cl. .......................... H03b 3/04; H03b 7/14

[58] Field of Search ......... 331/10, 34, 36 R, 96, 97, 331/107 R, 107 G, 177 R

[56] References Cited

UNITED STATES PATENTS 3,702,445 11/1972 Forterre .......................... 331/107 G

OTHER PUBLICATIONS

Tsai et al., IEEE Transactions on Microwave Theory and Techniques, Vol. MTT-18, Nov. 1970, pp. 883, 884.

Marriott, Design Electronics, Vol. 8 Nov. 1970, pp. 72–74, 112.

Primary Examiner—Siegfried H. Grimm
Attorney, Agent, or Firm—Ladas, Parry, Von Gehr, Goldsmith & Deschamps

[57] ABSTRACT

A frequency stabilized micro-wave signal source having as active element a semiconductor RF-generator comprising in combination a portion of wave-guide wherein electrically conducting mechanical support means are provided for supporting the semiconductor RF generator and feeding a supply voltage or current thereto. Said portion of wave-guide is coupled by a window with a resonant cavity loaded with ferrite supported by a dielectric further including a coil generating a magnetic field, in which said ferrite is immersed. The voltage or current supply terminal of said semiconductor RF generator is connected to a short time constant automatic frequency control circuit and said coil is connected to a long time constant frequency control circuit. Moreover, there may be provided means for varying the current in said coil to provide a coarse tuning of said ferrite loaded resonant cavity. The semiconductor RF generator used according the present invention is a Gunn diode.

4 Claims, 5 Drawing Figures

ELECTRONICALLY TUNABLE GUNN OSCILLATOR WITH AUTOMATIC FREQUENCY CONTROL

This application is a continuation-in-part of our prior application U.S. Ser. No. 291,455 filed Sept. 22, 1972 and now abandoned.

This invention relates to a frequency stabilized microwave signal source using as active device for the generation of microwave energy a Transferred Electron Device, in particular a Gunn diode. The aim of the invention is to provide a RF source of the above kind having a very low residual Frequency-modulated noise together with capability of tuning on a relatively broad frequency range.

Indeed, Transferred Elctron Devices used as sources of microwave energy, are plagued by very-short term frequency instabilities which can be, for convenience, denominated as frequency modulated noise.

Several attempts have been made trying to overcome the main inconvenience of solid state microwave energy sources such as Gunn diodes consisting in a large frequency modulated intrinsic noise much larger than the equally intrinsic amplitude modulated noise. One of the techniques for attenuating such frequency-modulated noise is to couple the Gunn diode to a high-Q resonant cavity. This entails disadvantages caused by the fact that the tuning of a high-Q resonant cavity is inherently slow. Indeed usually a resonant cavity is tuned either by movable inserts or sliding shorts all of mechanical character with all the attendant inconveniences. Another technique for reducing the frequency-modulated noise is to control the power supply to the Gunn diode which affects the nominal operating frequency of such devices. The range of tuning is however very limited, because the output power changes very appreciably with the D.C. power input to the Gunn diode. (see for instance Transferred Electron Devices by P. J. Bulman, et al, Academic Press London -New York, 1972, pages 231 to 244 and pages 285 to 289, describing the frequency-modulated noise problem in these devices, and some kinds of cavity stabilized energy sources, respectively).

Of course Automatic Frequency Control circuits are well known and established in the art, but, up to now, no information is available about how to harness efficiently these known circuits to a Gunn diode microwave source combining together ease of tuning over a relatively broad frequency range and with a very reduced residual frequency-modulated noise.

The present invention will be now disclosed with reference to the attached drawings in which.

Figure 1:
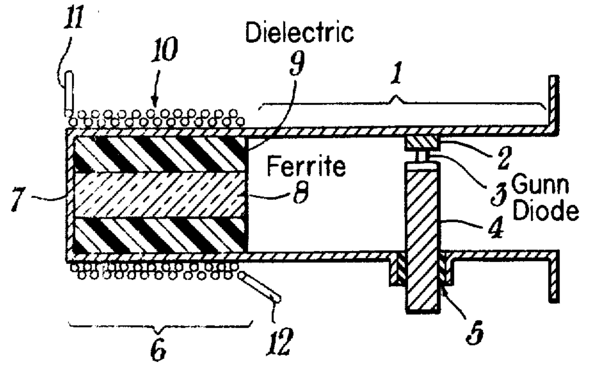
FIG. 1 shows in a schematical way the arrangement of Gunn diode oscillator mounted in a waveguide section and coupled with a ferrite loaded resonant cavity for its tuning.

As it has been stated before the object of the invention is to provide a frequency-stabilized microwave energy source which can be tuned electrically over a relatively great frequency range and having a low residual frequency-modulated noise. With reference to FIG. 1 the basic arrangement according to the invention comprises a section of waveguide 1 wherein a metallic post 2 is secured for the ground terminal of a negative-resistance transferred electron device, such as a Gunn diode 3 the other terminal of the diode 3 is connected to a stud 4 which passes through a RF shorting capacitor schematically shown in 5.

The stud 4 protrudes beyond the capacitor 5 for the connection of the supply of electric power to the diode 3.

The portion 6 of the waveguide closed at its end by a shorting plate 7 constitutes a resonant cavity. Indeed, the waveguide section 6 comprises a ferrite 8 embedded and supported by a dielectric 9 which fills the internal space of the waveguide as shown in FIG. 1.

Over the portion 6 waveguide (assumed as usual as being made of non-magnetic material) there is provided a coil or solenoid 10 having two terminals 11, 12 for the supply of electric power to said coil for setting up a magnetic field which permits to change the resonance frequency of the cavity constituted by the section 6, in order to provide both a coarse tuning of the oscillating frequency of the diode 3 and the application of a slow A.F.C. signal.

Figure 2:
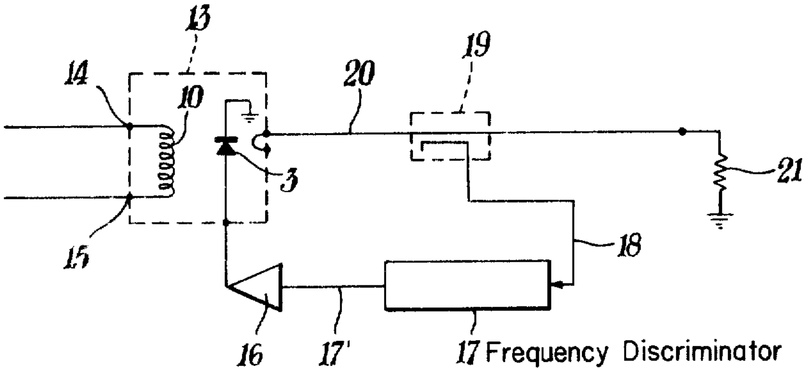
FIG. 2 shows a schematic diagram of the Automatic Frequency Control circuitry (Fast AFC) according to the invention.

With reference to FIG. 2 a possible in circuit arrangement of the device of FIG. 1 is shown schematically with the dotted box 13.

A coarse tuning current signal is applied to terminals 14, 15 for energizing the coil 10; the Gunn diode 3 is fed by the amplifier 16 which amplifies an error signal produced by the frequency discriminator 17 which may be an actual frequency discriminator or any other network or circuitry well known to a person skilled in the art capable of providing an error signal on the line 17' when a change from the preset frequency occurs. As aforesaid this error signal amplified by amplifier 16 varies the current (or voltage) supply to the diode 3 changing its oscillation frequency within a narrow range. The time constants of the circuit formed by frequency discriminator 17, amplifier 19 and diode 3 should have a short time constant i.e. to be sufficiently broad-band in order to cancel the frequency-modulated noise which would be otherwise generated by the diode 3 owing to its intrinsic characteristics.

The signal is fed to the discriminator 17 by the line 18 fed by a directional coupler 19 attached on the main transmission line 20 on which the output of the generator is available and feeds a load 21, e.g. an antenna.

The circuitry shown in FIG. 2 is the "fast A.F.C." circuit the purpose of which is to cancel the frequency-modulated noise. A "slow A.F.C." circuitry may also be added operating on the current flowing through the coil 10.

The term "slow A.F.C." means an automatic frequency control having a long time constant due, among other, to the relatively high inductance of the winding 10 magnetically coupled with the ferrite 8 (see FIGS. 1 and 2 of the drawings). Its main purpose is for tuning the oscillator. The term "fast A.F.C." means an automatic frequency control having a very short time constant due mainly to the low capacitances associated with the diode. This fast A.F.C. operates on the supply voltage (or current) of the diode through the above described feedback loop in order to cancel the "frequency modulated noise," i.e. random changes of the oscillation frequency which would be deleterious in embodiments where a "clean" signal is required.

Therefore according to the present invention a low frequency-modulation noise oscillator electrically adapted to be tuned on a broad band can be provided.

The frequency-modulation noise of an oscillator, expressed in Hz, is given by the following equation:

$$\Delta f_{rms} = \frac{fo}{Q} \sqrt{\frac{KTBM}{P_o}}\ , \qquad (1)$$

wherein $\Delta f_{rms}$ is the R.M.S. value of the F.M. noise, fo is the nominal frequency of the oscillator, Q is the quality factor of the resonant circuit, K is Boltzmann's constant, B is the frequency band over which the measurement is made, $P_o$ is the power produced by the oscillator, and M is the noise figure (s.Edison, P.I.R.E., 1948). On the other hand, the resonance frequency of the oscillator may be modified by changing the electric or magnetic energy stored in the resonant circuit (tank circuit) n $$\frac{\Delta f}{f} = \frac{\delta\epsilon e - \delta\epsilon m}{\epsilon e + \epsilon m} \qquad (2)$$

wherein f is the resonance frequency of the oscillator, $\epsilon_e$ is the electrical energy stored in the resonator, $\epsilon_m$ is the magnetic energy stored in the resonator, and $\Delta f$ is the change in the value of f arising from changes $\delta\epsilon_e$ and $\delta\epsilon_m$ in the values of $\epsilon_e$ and $\epsilon_m$. The elements for changing the electric energy $\epsilon_e$ (for example, varactors) have a low Q value and thus, if high $\Delta f$ values are desired, this causes a deterioration of the Q value of the oscillator and therefore, taking into account the equation (1) also of the frequency-modulation noise.

The ferrite elements for changing the magnetic energy maintain at a high level the Q value, through the frequency variation.

The provision of such ferrimagnetic devices, although achieving very good levels of the F.M. moise, is a limitation to further improvement. The band pass of the tuning circuits of the ferrimagnetic type is, in effect, typically narrow and this hinders the connection of the oscillator with a cancellation loop for the residual noise without any further complications of the circuit.

The solution of the problem, consists therefore in the use of the power supply line of the diode oscillator itself as a means for cancelling F.M. noise (as disclosed also by Tsai et al., I.E.E.E. Transactions on Microwave Theory and Techniques, Vol. MTT-18, Nov. 1970, pp. 883 and 884).

The use of the power supply line in combination with the tuning by a ferrimagnetic system is not obvious. The simple control on the power supply does not give by itself generally satisfactory results owing to the limited tuning band, great power variations on the band and low precision and repeatability of the attained values. However, by virtue of the combination according to the present invention these disadvantages have not importance and it is thus possible to adopt a particularly simple solution.

Thus, according to the present invention there is obtained an oscillator having two modulation modes, a slow one and a fast one. The slow modulation mode serves for the coarse tuning but assures also a high Q value of the oscillator (ferrimagnetic tuning), and thus a low F.M. noise. The fast modulation mode serves for cancelling the residual noise around the frequency determined by the slow modulation mode, without any other tuning element to be connected with the circuit.

Figure 3:
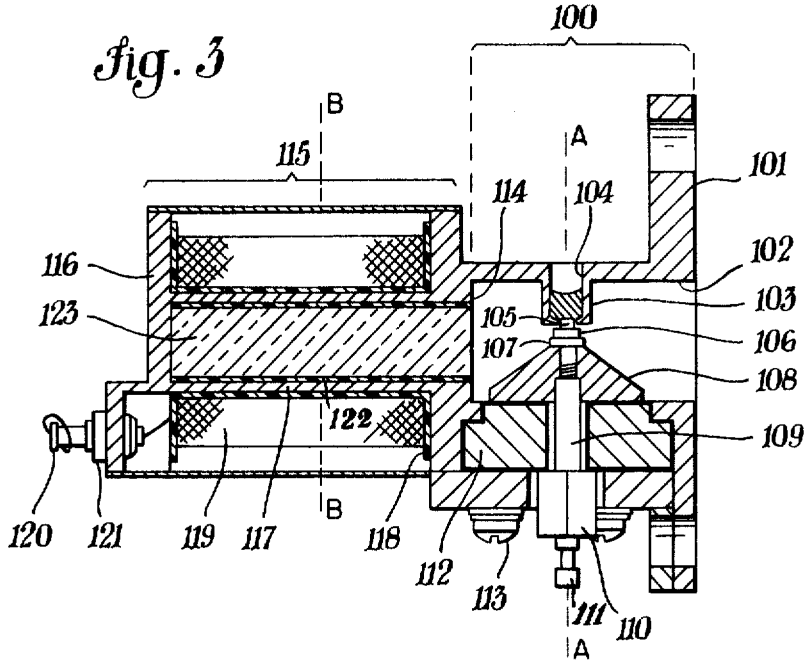
FIG. 3 shows in a longitudinal section a frequency-stabilized microwave signal source according to the invention in an actually preferred embodiment.
Figure 4:
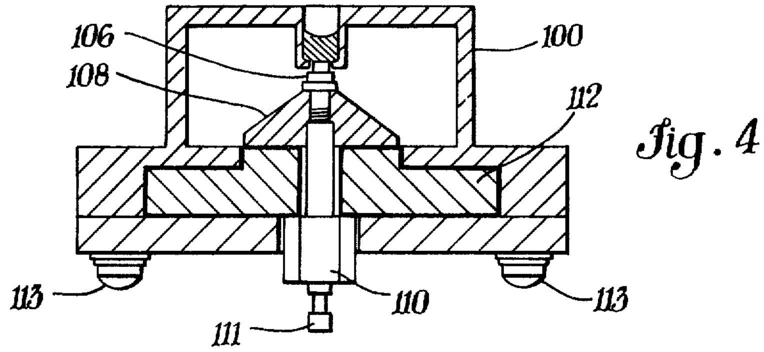
FIG. 4 shows a section taken on the plane A—A of FIG. 3.
Figure 5:
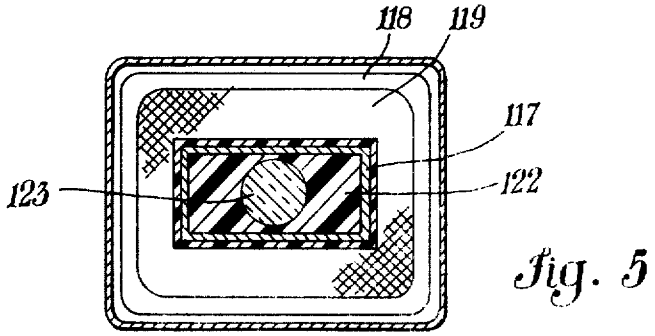
FIG. 5 shows a section taken on the plane B—B of FIG. 3.

Now, with reference to FIGS. 3, 4 and 5 an actual and preferred embodiment of the microwave source according to the present invention will be described in detail. In FIG. 3, there is shown a waveguide section 100, terminating at its right in the usual flanged waveguide connection 101. In the interior 102 of the waveguide section 100 there is provided a stud 103, electrically grounded, provided with a through-hole 104 which receives one of the terminals 105 (anode or cathode according to the diode manufacturer choice) of a Gunn diode 106.

The other terminal 107 of the diode 106 rests or is screwed on the tapered post 108 which is electrically connected with the bar 109 which is supported by the insulating bushing 110 and ends with a soldering terminal 111. (The electrical supply to the diode 106 is effected between said terminal 111 and ground constituted by the body of the device).

The part 108 is frusto-conical and rests on the insert 112 fastened to the waveguide by means of screws 113. An electric short between part 108, insert 112 and its seat on the waveguide walls is prevented, in a preferred embodiment, by machining the members 108, 112 but from aluminum stock which is carefully anodized by known processes in order to cover them with an insulating layer of aluminum oxide (represented in FIGS. 3 and 4 by a heavy line). This layer of aluminum oxide constitutes the dielectric of the RF by-pass capacitor indicated in 5 in FIG. 1, thus avoiding the need of a discrete by-pass capacitor.

The waveguide section 100 continues at the left (FIG. 3) and terminates with a wall 114 wherein a window is defined for the "loaded" waveguide section 115 which ends with a shorting wall 116. The walls of the "loaded" waveguide section are indicated in 117.

Around the waveguide walls 117 there is arranged a bobbin 118 wherein a coil 119 is wound. A first end of the coil or winding 119 is grounded (not shown) and the other one is brought to the soldering lug 120 mounted in an insulating bushing 121. The interior of the rectangular waveguide defined by the walls 117 is filled with a low loss dielectric 122, wherein a ferrite rod 123 is imbedded. All these parts are assembled with tightfitting in order to have a good mechanical stability.

It will be understood that the waveguide section 115 constitutes the electrically adjustable resonator which allows to set electrically the nominal operating frequency of the Gunn diode, while the frequency-modulated noise of the signal produced by the same is reduced with the above disclosed circuital arrangement. The step constituted by the wall 114 constitutes a transformer for matching the loaded waveguide section resonant cavity 115 with the waveguide space occupied by the diode.

It can be seen now that according to the present invention a solid state microwave source has been provided, which is compact, rugged, reliable and capable of providing performances equal if not better than klystron tubes, overcoming the inconveniences connected with the use of solid state microwave sources such as Gunn diodes amply disclosed in the literature on this art.

Having thus described the invention what is claimed is:

1. A frequency stabilized micro-wave signal source having as active element a semiconductor RF-generator comprising in combination a first portion of waveguide wherein electrically conducting mechanical support means are provided for supporting said semiconductor RF generator and feeding a supply voltage or current thereto; said first portion of waveguide being coupled by a window with a second portion of waveguide constituting a resonant cavity loaded with ferrite supported by a dielectric, further including a coil for producing a magnetic field in which said ferrite is immersed; the voltage or current supply terminal of said semiconductor RF generator being connected to a power supply controlled by a short time constant automatic frequency control circuit, said coil being connected to a long time constant frequency control circuit.

2. A frequency stabilized micro-wave signal source having as active element a semiconductor RF-generator, comprising in combination a first portion of waveguide wherein electrically conducting mechanical support means are provided for supporting said semiconductor RF generator and feeding a supply voltage or current thereto; said first portion of waveguide being coupled by a window with a second portion of waveguide constituting a resonant cavity loaded with ferrite supported by a dielectric further including a coil for producing a magnetic field in which said ferrite is immersed; the voltage or current supply terminal of said semiconductor RF generator being connected to a power supply controlled by a short time constant automatic frequency control circuit, said coil being connected to a long time constant frequency control circuit and means for varying the current in said coil to provide a coarse tuning of said ferrite loaded resonant cavity.

3. A frequency stabilized microwave signal source according to claim 1 wherein said semiconductor RF generator is a Gunn diode.

4. A frequency stabilized microwave signal source according to claim 2 wherein said semiconductor RF generator is a Gunn diode.

* * * * *